United States Patent
Li et al.

(10) Patent No.: US 7,242,224 B1
(45) Date of Patent: Jul. 10, 2007

(54) CONTINUOUS, WIDE-RANGE FREQUENCY SYNTHESIS AND PHASE TRACKING METHODS AND APPARATUS

(75) Inventors: Yingxuan Li, Cupertino, CA (US);
Pantas Sutardja, Los Gatos, CA (US)

(73) Assignee: Marvell International Ltd., Hamilton (BM)

( * ) Notice: Subject to any disclaimer, the term of this patent is extended or adjusted under 35 U.S.C. 154(b) by 95 days.

(21) Appl. No.: 10/990,216

(22) Filed: Nov. 15, 2004

Related U.S. Application Data

(60) Provisional application No. 60/547,727, filed on Feb. 24, 2004, provisional application No. 60/546,419, filed on Feb. 20, 2004.

(51) Int. Cl.
*H03B 21/00* (2006.01)
(52) U.S. Cl. ............. 327/105; 327/147; 327/156; 331/1 A
(58) Field of Classification Search ............... None
See application file for complete search history.

(56) References Cited

U.S. PATENT DOCUMENTS

| | | | |
|---|---|---|---|
| 6,114,914 A * | 9/2000 | Mar | 331/16 |
| 6,456,165 B1 * | 9/2002 | Kelkar | 331/17 |
| 6,556,086 B2 * | 4/2003 | Keaveney et al. | 331/1 A |
| 6,943,600 B2 * | 9/2005 | Craninckx | 327/157 |

OTHER PUBLICATIONS

U.S. Appl. No. 10/802,597, filed Mar. 14, 2004, Cheng.

* cited by examiner

*Primary Examiner*—Timothy P. Callahan
*Assistant Examiner*—An T. Luu

(57) ABSTRACT

Circuitry and methods are provided for continuously adjustable frequency synthesis. The synthesis covers a wide range of possible frequencies and can be performed to a high degree of precision. In an embodiment of the invention, an analog phase-locked loop ("PLL") performs relatively coarse wide-range frequency synthesis, while a digital PLL performs relatively fine narrow-range frequency synthesis and phase alignment. The analog PLL is capable of varying frequency in a stepwise linear fashion. The digital PLL communicates with the analog PLL to ensure that the output of the analog PLL is within the digital PLL's specified pull-in range.

57 Claims, 4 Drawing Sheets

CONTINUOUS, WIDE-RANGE FREQUENCY SYNTHESIS AND PHASE TRACKING METHODS AND APPARATUS

This application claims the benefit of provisional application No. 60/546,419, filed Feb. 20, 2004, and provisional application No. 60/547,727, filed Feb. 24, 2004, which are hereby incorporated by reference herein in their entireties.

BACKGROUND OF THE INVENTION

Clock signals are commonly used to synchronize processing, sample data, and perform general timing coordination in electrical systems. The widespread use of clock signals makes proper maintenance of their frequency and phase extremely important. The phase locked loop ("PLL") is a well known mechanism for performing this maintenance, often aligning the clock signal with an incoming data stream.

Unfortunately, certain applications make clock synchronization especially difficult. For instance, optical systems often read data from media such as compact discs ("CDs"), which store the data in circular spiral tracks. Since the reader on many such systems advances along the spiral track at a substantially constant angular velocity, the data rate changes continuously. That is, the data rate near the center of a CD is relatively slow, while the data rate near the edge of a CD is relatively fast.

Optical systems thus give rise to the problem of aligning a clock signal to data whose frequency and phase vary continuously. Most PLLs are well adapted to locking onto a fixed frequency and phase, then maintaining the locked state. Thus, common PLL circuitry is often poorly suited to demands such as those posed by optical systems.

In view of the foregoing, it would be desirable to provide circuitry and methods that can synchronize a clock signal to data whose frequency and phase vary continuously. In addition, it would be desirable for such circuitry and methods to operate across a wide range of possible frequencies, while maintaining a high degree of precision.

SUMMARY OF THE INVENTION

In accordance with this invention, circuitry and methods are provided for continuous, wide-range frequency synthesis and phase tracking. An embodiment of the invention includes an analog PLL coupled to a digital PLL.

The analog PLL may include a frequency/phase detector, a charge pump, a loop filter, and a voltage-controlled oscillator ("VCO"), all of which are common in PLLs. The analog PLL may also include an input divider, a feedback divider, and a phase interpolator to aid in frequency synthesis. In addition, digital filters and control logic may be included to adjust the frequency of the analog PLL's output clock signal.

The analog PLL's output clock is used as an input to the digital PLL. The digital PLL may include an analog-to-digital converter ("ADC"), a digital filter and logic, a digital integrator, and a phase interpolator. The digital PLL also generates an up/down output signal that is used by the analog PLL's digital filters and control logic.

The analog PLL performs relatively wide-range frequency synthesis by controlling its feedback counter and phase interpolator appropriately. The frequency can be adjusted in a stepwise linear fashion, to precisely track corresponding variations in data rate. This stepwise linear variation provides precise frequency synthesis across a wide range of frequencies.

The digital PLL performs fine frequency synthesis and phase tracking by adjusting the clock signal generated by the analog PLL. However, the digital PLL has a relatively small pull-in range, which defines a range of frequencies that can be handled effectively by the circuitry. If it detects that the clock signal generated by the analog PLL may be outside the pull-in range, it sends a signal to the analog PLL indicating whether it should increase or decrease the frequency of that clock signal. In this fashion, the two PLL circuits work together to coordinate the tracking of frequency and phase.

The invention therefore advantageously allows continuous adjustment of clock signal frequency and phase. The adjustment is very precise and can be performed across a wide range of frequencies, making it well suited to applications like optical data sampling where the incoming data rate varies continuously.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
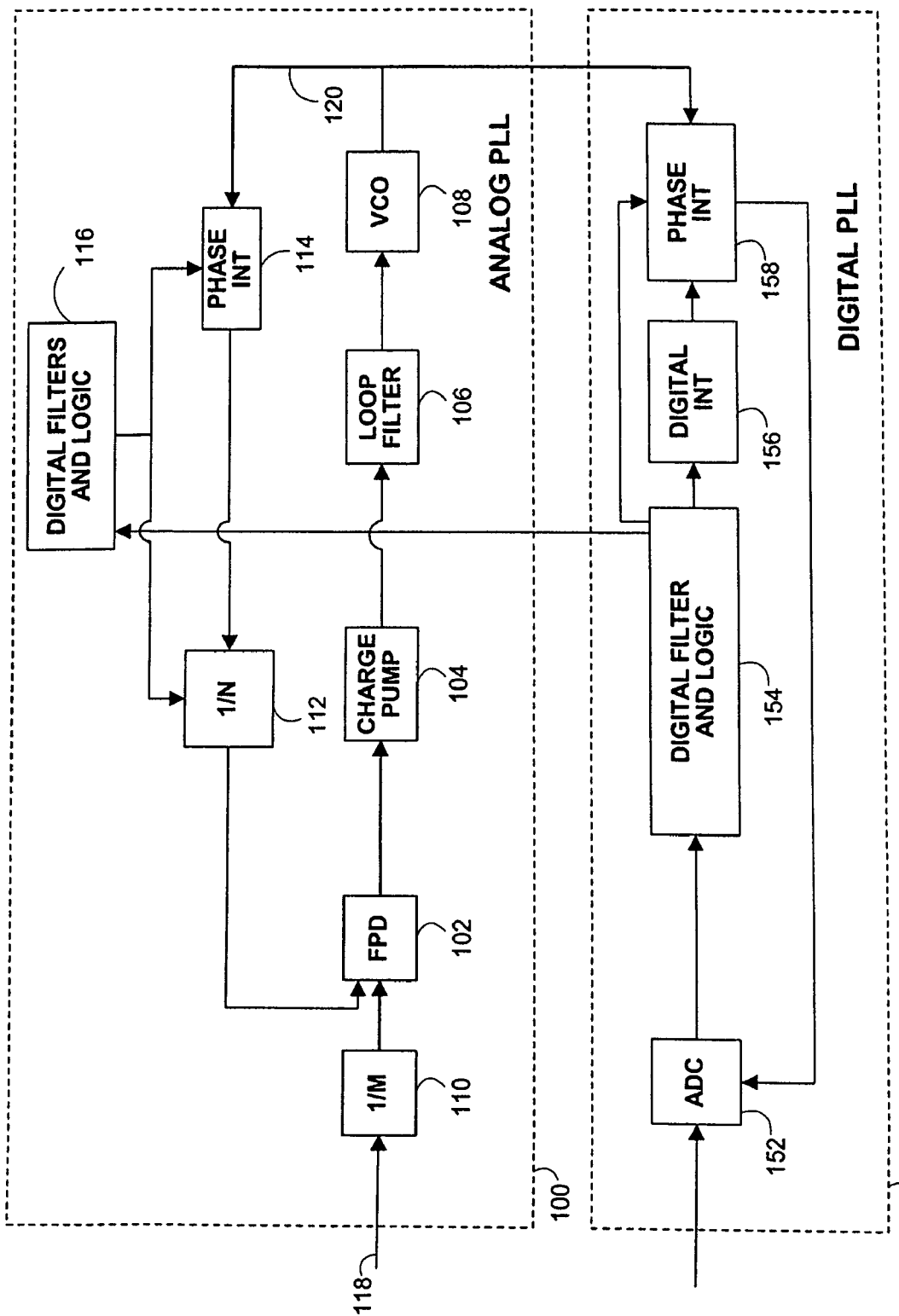
FIG. 1 is a block diagram of an illustrative analog PLL and an illustrative digital PLL in accordance with the invention.

FIG. 1 shows an illustrative analog PLL 100 and an illustrative digital PLL 150 in accordance with the invention. Analog PLL 100 effectively aligns the frequency of reference clock signal 118 and feedback clock signal 120. Analog PLL 100 includes frequency/phase detector 102, charge pump 104, loop filter 106, and VCO 108, all of which work to align the two clock signals mentioned above. The operation of PLLs including circuitry such as that listed above is well known in the art, and is described, for example, in U.S. patent application Ser. No. 10/802,597, filed Mar. 16, 2004, which is hereby incorporated by reference in its entirety.

Analog PLL 100 also includes dividers 110 and 112, phase interpolator 114, and digital filters and control logic 116. Dividers 110 and 112 serve to scale the frequency of the output of VCO 108, which is ultimately sent to digital PLL 150. Divider 110 divides the frequency of the reference clock signal by a factor of M, while divider 112 divides the frequency of the feedback clock signal by a factor of N. Thus, feedback clock signal 120 has a frequency of roughly N/M that of reference clock signal 118. The divider ratio N of divider 112 is set by digital filters and control logic 116.

Phase interpolator 114 is capable of introducing a specified phase delay into each cycle of VCO 108's output clock signal, as described in U.S. patent application Ser. No. 10/802,597. The operation of phase interpolator 114 is controlled by digital filters and control logic 116. Let Fref refer to the frequency of reference clock signal 118, Tvco refer to the period of feedback clock signal 120, and dT1 refer to the phase delay introduced into each clock period by phase interpolator 114. Also, let the frequency Fvco be defined as $$\frac{1}{Tvco}$$

In one embodiment, delay dT1 can be controlled by digital filters and logic 116 such that $$\frac{dT1}{Tvco}$$

can vary between 0 and $$\frac{1}{N}$$

allowing fine-grained linear variation of the frequency Fvco between the values $$\left(\frac{N}{M}*Fref\right)$$

and $$\left(\frac{N+1}{M}*Fref\right).$$

Digital filters and logic 116 can also set the divider ratio N of divider 112, allowing coarser-grained control of Fvco and widening the frequency range that Fvco can cover. The control information output by digital filters and logic 116 is represented as a single data word of Y+X bits, where the Y most significant bits represent the divider ratio N and the X least significant bits represent the phase interpolator delay dT1. Thus, by incrementing or decrementing this data word by 1, Fvco can be varied from $$\left(\frac{N}{M}*Fref\right)$$

to $$\left(\frac{N+1}{M}*Fref\right)$$

in $2^X$ steps. When that narrow frequency range is no longer sufficient, Fvco can be varied further by controlling the Y most significant bits to set N as desired.

The output of analog PLL 100 is generated from VCO 108 and sent to digital PLL 150, which includes ADC 152, digital filter and logic 154, digital integrator 156, and phase interpolator 158. Digital PLL 150 performs even further refinement to the clock signal synthesized by analog PLL 100. Let Tadc refer to the period of the clock signal used by ADC 152 to sample data and dT2 refer to the delay introduced by phase interpolator 158. By setting $$\frac{dT2}{Tvco}$$

appropriately, finer grained frequency control can be achieved than by using only analog PLL 100.

Although digital PLL 150 can generate an ADC clock with relatively high precision, its operable frequency range ("pull-in range") is quite small. For this reason, digital filter and logic 154 of digital PLL 150 communicates up/down signals to digital filters and logic 154 of analog PLL 100, indicating if Fvco is too high or too low. Digital filters and logic 116 uses this information to adjust Fvco as needed, by controlling divider 112 and phase interpolator 114.

Figure 2:
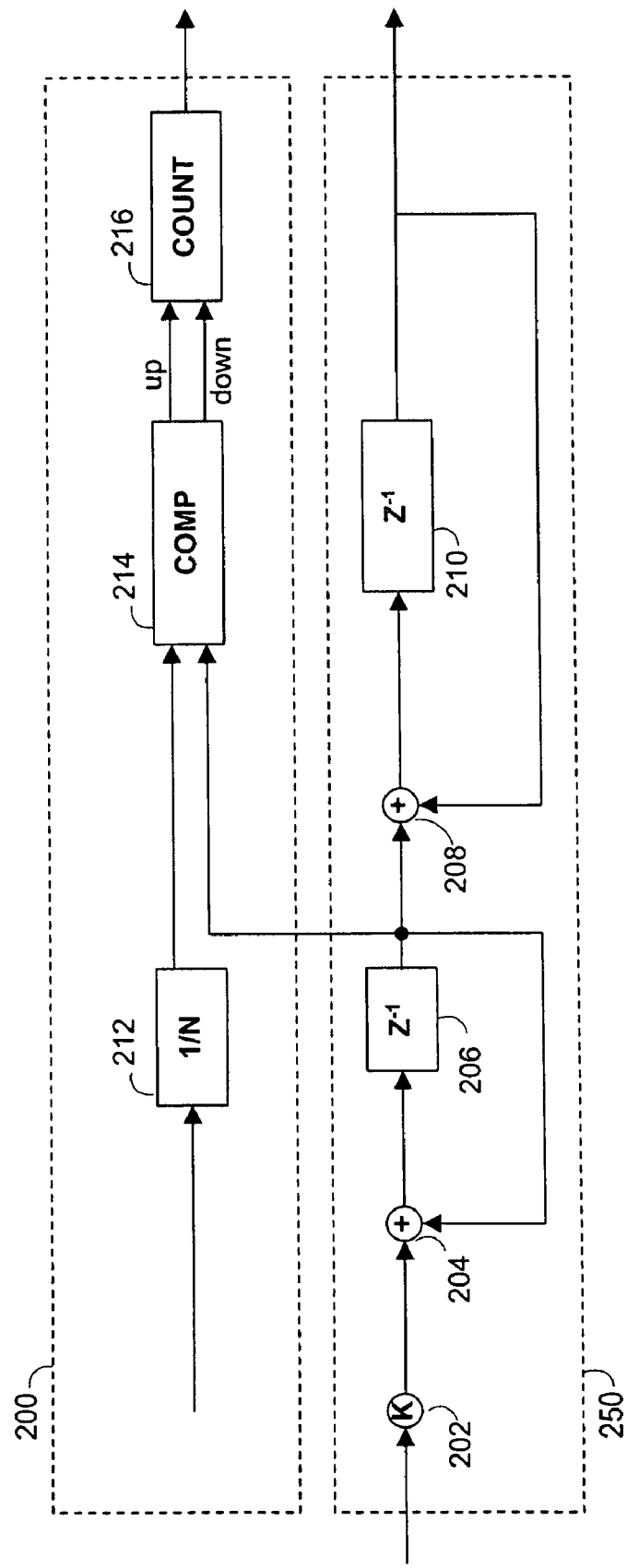
FIG. 2 is a block diagram of illustrative digital filters and logic in accordance with the invention.

FIG. 2 shows illustrative digital filters and logic 200 that may be used as digital filters and logic 116 of FIG. 1 in accordance with the invention. Digital filters and logic 200 include reciprocal operator 212, comparator 214, and counter 216. Reciprocal operator 212 accepts divider ratio N as input and generates the corresponding mathematical reciprocal $$\frac{1}{N}$$

which is used by comparator 214. Comparator 214 compares $$\frac{dT1}{Tvco}$$

to $$\frac{1}{N}$$

and controls counter 216 appropriately using up/down signals. This control ensures a smooth transition from the use of phase interpolator 114 for frequency control to the use of divider 112 for frequency control. That is, the low and high order bits of the data word output from digital filters and logic 116 are varied in a way that guarantees a strictly linear increase or decrease in the frequency Fvco. Digital filter and logic 250, which may be used as digital filter and logic 154 of FIG. 1 in accordance with the invention, includes multiplier 202, adder 204, delay block 206, adder 208, and delay block 210.

Figure 3:
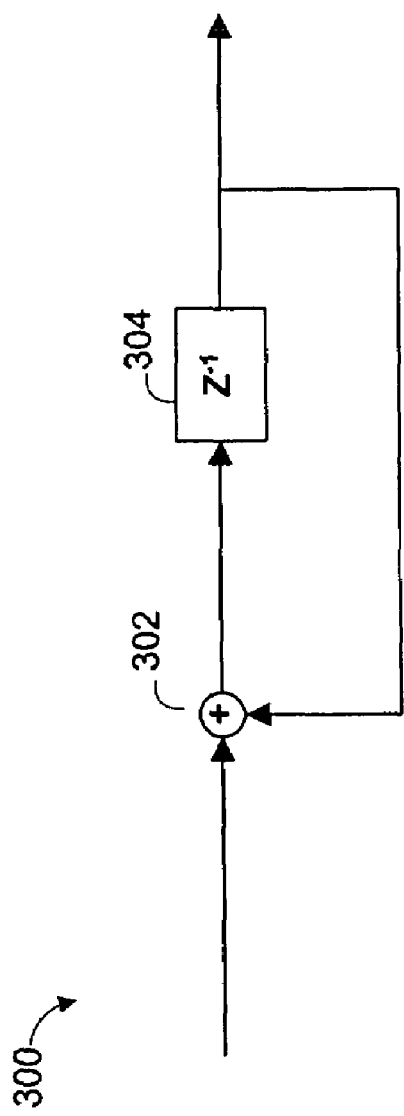
FIG. 3 is a block diagram of an illustrative digital integrator in accordance with the invention.

FIG. 3 shows an illustrative digital integrator 300 that may be used as digital integrator 156 of FIG. 1 in accordance with the invention. Digital integrator 300 includes adder 302 and delay block 304, connected in a feedback configuration.

Figure 4:
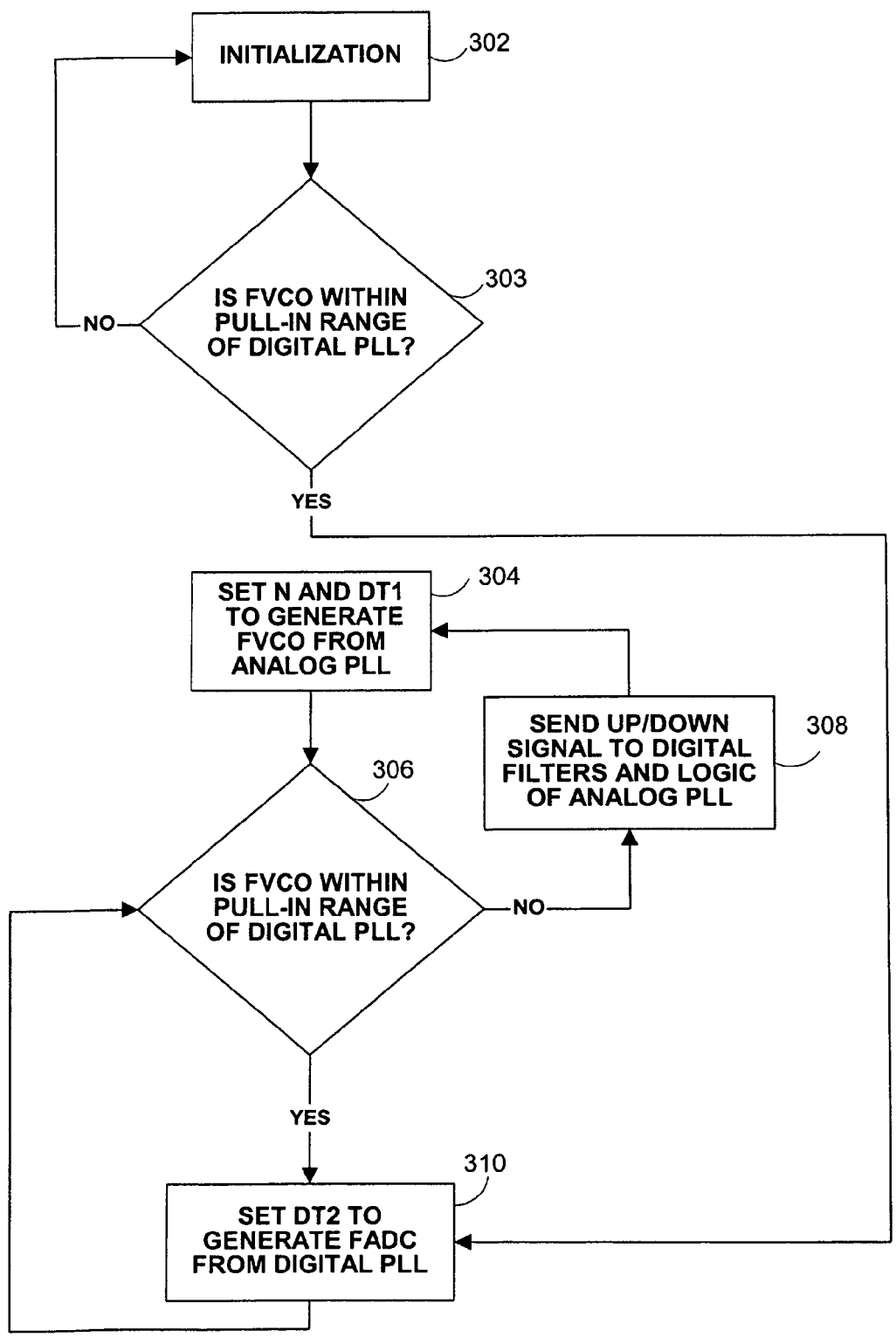
FIG. 4 is a flow diagram of an illustrative method for performing frequency synthesis in accordance with the invention.

FIG. 4 shows an illustrative method for performing frequency synthesis in accordance with the invention. At step 302, initialization occurs by roughly estimating the target ADC clock frequency. This estimate can be performed in a variety of ways. For instance, if the invention is used in a magnetic or optical disk drive system, the spindle speed of the drive can be used to derive an estimate of the target ADC clock frequency. Alternatively, a more accurate estimate may be obtained by observing the average frequency of data bit transitions over a certain period of time. At step 303, this estimate is examined by digital PLL 150 to determine whether or not the estimated frequency falls within the specified pull-in range. For instance, step 303 may be performed by finding the difference between Fvco and the frequency of the incoming data, then comparing that difference to a threshold. The threshold may be a certain percentage of the incoming data rate. If not, then initialization is performed again at step 302 to generate another estimate of the target ADC clock frequency.

On the other hand, if the estimate is within the pull-in range, then digital PLL 150 sets phase interpolator delay dT2 to generate an ADC clock signal with frequency Fadc, which is a very precise match to the incoming data stream. This ADC clock signal generated in step 310 can be used to sample the incoming data, or for any other suitable purpose.

After dT2 is set accordingly, the method proceeds to step 306, where digital PLL 150 tests whether Fvco is within the acceptable pull-in range. This testing may be performed by determining the difference between clock frequency Fvco and the frequency of the incoming data, then comparing that difference to an appropriate threshold. For instance, suppose the pull-in range is approximately 1% of the incoming data rate at any given time. Then a stricter threshold of approximately 0.8% may be used to determine whether the measured difference is acceptably small. Alternatively, the testing may be performed by comparing Fvco to two thresholds that vary with the frequency of the incoming data (one threshold at the high end of the range, one at the low end). As before, these thresholds may be chosen to be more strict than the actual pull-in range. If Fvco does not fall within the pull-in range, an up/down signal is sent at step 308 to digital filters and logic 116 of analog PLL 100. Analog PLL 100 then adjusts N and dT1 appropriately in step 304. However, if Fvco is in the pull-in range, the method proceeds again to step 310, where delay dT2 is set to generate an appropriate ADC clock frequency Fadc, thereby commencing the next iteration.

Note that the embodiments described herein and illustrated in FIGS. 1–4 are merely illustrative, and alternative embodiments could be used. For instance, although the invention has been described primarily in the context of optical disk drives, which often have constantly varying data phase and frequency, the invention could be applied to any electronic system with similar needs. In addition, the invention does not have to be used in the context of analog-to-digital conversion. The invention could be used to facilitate the sampling of digital data at the end of a transmission link, to eliminate clock skew resulting from clock distribution networks, or any other purpose for which PLLs are used.

Furthermore, similar concepts could be applied to delay-locked loops ("DLLs"), which do not use VCOs but rather variable delay chains. In that scenario, frequency would still be modified by dividers 110 and 112, as well as phase interpolators 114 and 158, but not by VCO 108. In addition, particular blocks such as digital filters and logic 116 could be implemented in a variety of suitable ways without deviating from the spirit and scope of the invention.

Thus it is seen that circuits and methods are provided for achieving continuous wide range frequency synthesis and phase tracking. One skilled in the art will appreciate that the invention can be practiced by other than the described embodiments, which are presented for purposes of illustration and not of limitation, and the present invention is limited only by the claims which follow.

We claim:

1. A method of performing frequency synthesis for an output clock signal, the method comprising:
   setting a first phase interpolator delay;
   introducing said first phase interpolator delay into each cycle of said output clock signal; and
   setting a first divider ratio, wherein:
   said setting said first phase interpolator delay and said setting said first divider ratio produce a substantially linear variation in a frequency of said output clock signal;
   said setting said first phase interpolator delay produces a first variation in said frequency;
   said setting said first divider ratio produces a second variation in said frequency; and
   said first variation in said frequency is substantially smaller than said second variation in said frequency.

2. A method of reading data in a disk drive system comprising the method of claim 1.

3. The method of claim 1 wherein said setting said first phase interpolator delay is performed using bits of a data word.

4. The method of claim 3 wherein said setting said first divider ratio is performed using other bits of said data word.

5. The method of claim 1 wherein said setting said first divider ratio comprises:
   comparing a quantity derived from said first phase interpolator delay to a threshold; and
   deciding to set said first divider ratio based on a result of said comparing.

6. The method of claim 1 further comprising setting a second phase interpolator delay.

7. The method of claim 6 wherein:
   said setting said first phase interpolator delay and said setting said first divider ratio generate an intermediate clock signal; and
   said setting said second phase interpolator delay generates said output clock signal using said intermediate clock signal.

8. The method of claim 7 further comprising using said output clock signal to perform analog-to-digital conversion.

9. The method of claim 8 further comprising performing digital integration on a signal coupled to an output of said analog-to-digital conversion.

10. The method of claim 9 further comprising detecting whether a frequency of said intermediate clock signal is within a pull-in range.

11. The method of claim 10 wherein said detecting comprises detecting whether said intermediate frequency is within a range smaller than said pull-in range.

12. The method of claim 10 further comprising generating a signal indicating whether said intermediate frequency is greater than or less than said pull-in range when said intermediate frequency is not within said pull-in range.

13. The method of claim 1 further comprising:
   estimating a data rate; and
   setting said frequency of said output clock signal to be substantially equal to said data rate.

14. The method of claim 13 wherein said estimating comprises determining an approximate spindle speed of a disk drive system.

15. The method of claim 13 wherein said estimating comprises determining an approximate data transition rate.

16. The method of claim 13 further comprising setting a second divider ratio.

17. The method of claim 16 further comprising:
detecting a phase difference between an output of said first divider and an output of said second divider; and
generating a pulse indicative of said phase difference.

18. The method of claim 17 further comprising:
generating a voltage signal based on the width of said pulse; and
filtering said voltage signal.

19. The method of claim 18 further comprising:
generating an intermediate clock signal based on a voltage level of said voltage signal, wherein:
said frequency of said output clock signal is derived from a frequency of said intermediate clock signal.

20. A circuit for performing frequency synthesis for an output clock signal, the circuit comprising:
means for setting a first phase interpolator delay;
means for introducing said first phase interpolator delay into each cycle of said output clock signal; and
means for setting a first divider ratio, wherein:
said means for setting said first phase interpolator delay and said means for setting a first divider ratio produce a substantially linear variation in a frequency of said output clock signal;
said means for setting said first phase interpolator delay produces a first variation in said frequency;
said means for setting said first divider ratio produces a second variation in said frequency; and
said first variation in said frequency is substantially smaller than said second variation in said frequency.

21. The circuit of claim 20 wherein said means for setting said first phase interpolator delay sets said first phase interpolator delay using bits of a data word.

22. The circuit of claim 21 wherein said means for setting said first divider ratio sets said first divider ratio using other bits of said data word.

23. The circuit of claim 20 wherein said means for setting said first divider ratio comprises:
means for comparing a quantity derived from said first phase interpolator delay to a threshold; and
means for deciding to set said first divider ratio based on a result of said comparing.

24. The circuit of claim 20 further comprising means for setting a second phase interpolator delay.

25. The circuit of claim 24 wherein:
said means for setting said first phase interpolator delay and said means for setting said first divider ratio determine a frequency of an intermediate clock signal; and
said means for setting said second phase interpolator delay determines said frequency of said output clock signal using said intermediate clock signal.

26. The circuit of claim 25 further comprising means for using said output clock signal to perform analog-to-digital conversion.

27. The circuit of claim 26 further comprising means for performing digital integration on a signal coupled to an output of said analog-to-digital conversion.

28. The circuit of claim 27 wherein said means for setting said second phase interpolator delay comprises means for detecting whether a frequency of said intermediate clock signal is within a pull-in range.

29. The circuit of claim 28 wherein said means for detecting comprises means for detecting whether said intermediate frequency is within a range smaller than said pull-in range.

30. The circuit of claim 28 further comprising means for generating a signal indicating whether said intermediate frequency is greater than or less than said pull-in range when said intermediate frequency is not within said pull-in range.

31. A disk drive system comprising the circuit of claim 20.

32. The circuit of claim 20 further comprising:
means for estimating a data rate; and
means for setting said frequency of said output clock signal to be substantially equal to said data rate.

33. The circuit of claim 32 wherein said means for estimating comprises means for determining an approximate spindle speed of a disk drive system.

34. The circuit of claim 32 wherein said means for estimating comprises means for determining an approximate data transition rate.

35. The circuit of claim 32 further comprising means for setting a second divider ratio.

36. The circuit of claim 35 further comprising:
means for detecting a phase difference between an output of said first divider and an output of said second divider; and
means for generating a pulse indicative of said phase difference.

37. The circuit of claim 36 further comprising:
means for generating a voltage signal based on the width of said pulse; and
means for filtering said voltage signal.

38. The circuit of claim 37 further comprising:
means for generating an intermediate clock signal based on a voltage level of said voltage signal, wherein:
said frequency of said final clock signal is derived from a frequency of said intermediate clock signal.

39. A circuit for performing frequency synthesis for an output clock signal, the circuit comprising:
logic for setting a first phase interpolator delay;
a phase interpolator for introducing said first phase interpolator delay into each cycle of said output clock signal; and
logic for setting a first divider ratio, wherein:
said logic for setting said first phase interpolator delay and said logic for setting said first divider ratio produce a substantially linear variation in a frequency of said output clock signal;
said logic for setting said first phase interpolator delay produces a first variation in said frequency; and
said logic for setting said first divider ratio produces a second variation in said frequency, wherein:
said first variation in said frequency is substantially smaller than said second variation in said frequency.

40. The circuit of claim 39 wherein said logic for setting said first phase interpolator delay sets said first phase interpolator delay using bits of a data word.

41. The circuit of claim 40 wherein said logic for setting said first divider ratio sets said first divider ratio using other bits of said data word.

42. The circuit of claim 39 wherein said logic for setting said first divider ratio comprises:
a comparator for comparing a quantity derived from said first phase interpolator delay to a threshold; and
a counter for deciding to set said first divider ratio based on a result of said comparing.

43. The circuit of claim 39 further comprising logic for setting a second phase interpolator delay.

44. The circuit of claim 43 wherein:
said logic for setting said first phase interpolator delay and said logic for setting said first divider ratio determine a frequency of an intermediate clock signal; and said logic for setting said second phase interpolator delay determines said frequency of said output clock signal using said intermediate clock signal.

45. The circuit of claim 44 further comprising a converter for using said output clock signal to perform analog-to-digital conversion.

46. The circuit of claim 45 further comprising an integrator for performing digital integration on a signal coupled to an output of said analog-to-digital conversion.

47. The circuit of claim 46 wherein said logic for setting said second phase interpolator delay comprises logic for detecting whether a frequency of said intermediate clock signal is within a pull-in range.

48. The circuit of claim 47 wherein said logic for detecting comprises logic for detecting whether said intermediate frequency is within a range smaller than said pull-in range.

49. The circuit of claim 47 further comprising logic for generating a signal indicating whether said intermediate frequency is greater than or less than said pull-in range when said intermediate frequency is not within said pull-in range.

50. A disk drive system comprising the circuit of claim 39.

51. The circuit of claim 39 further comprising:
initialization logic for estimating a data rate; and
logic for setting said frequency of said output clock signal to be substantially equal to said data rate.

52. The circuit of claim 51 wherein said initialization logic for estimating comprises logic for determining an approximate spindle speed of a disk drive system.

53. The circuit of claim 51 wherein said initialization logic for estimating comprises logic for determining an approximate data transition rate.

54. The circuit of claim 51 further comprising logic for setting a second divider ratio.

55. The circuit of claim 54 further comprising:
a detector for detecting a phase difference between an output of said first divider and an output of said second divider, wherein:
said detector generates a pulse indicative of said phase difference.

56. The circuit of claim 55 further comprising:
a charge pump for generating a voltage signal based on the width of said pulse; and
a filter for filtering said voltage signal.

57. The circuit of claim 56 further comprising:
an oscillator for generating an intermediate clock signal based on a voltage level of said voltage signal, wherein:
said frequency of said final clock signal is derived from a frequency of said intermediate clock signal.

* * * * *